(12) United States Patent
Wang

(10) Patent No.: US 6,960,808 B2
(45) Date of Patent: Nov. 1, 2005

(54) SEMICONDUCTOR DEVICE HAVING A LOWER PARASITIC CAPACITANCE

(75) Inventor: Yu-Piao Wang, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/707,358

(22) Filed: Dec. 8, 2003

(65) Prior Publication Data

US 2005/0045865 A1 Mar. 3, 2005

(30) Foreign Application Priority Data

Aug. 25, 2003 (TW) .......................................... 92123253 A

(51) Int. Cl.[7] .................... H01L 29/76; H01L 29/94; H01L 31/062; H01L 27/108; H01L 31/113
(52) U.S. Cl. ...................... 257/346; 257/296; 257/382; 257/412
(58) Field of Search ................................. 257/346, 296, 257/382–383, 412, 773

(56) References Cited

U.S. PATENT DOCUMENTS

| 6,017,813 A | * | 1/2000 | Kuo ............................ 438/618 |
| 6,153,485 A | * | 11/2000 | Pey et al. .................... 438/305 |
| 6,326,257 B1 | * | 12/2001 | Hsu ............................. 438/238 |
| 6,482,699 B1 | * | 11/2002 | Hu et al. ..................... 438/258 |
| 6,630,721 B1 | * | 10/2003 | Ligon .......................... 257/413 |
| 2003/0052353 A1 | * | 3/2003 | Fujiwara et al. ............. 257/296 |
| 2004/0129959 A1 | * | 7/2004 | Kim et al. ................... 257/288 |

OTHER PUBLICATIONS

Chuang, D. R., *VLSI Process Technology*, Feb. 15, 1997, p. 404, Figure 11–9.

* cited by examiner

*Primary Examiner*—Shouxiang Hu
(74) *Attorney, Agent, or Firm*—Jianq Chyun IP Office

(57) ABSTRACT

A method for fabricating a semiconductor device is described. A gate dielectric layer is formed on a substrate, and several gate structures having a gate conductor, a cap layer and spacers are formed on the gate dielectric layer. A mask layer is formed over the substrate covering a portion of the gate structures. Removing the cap layer and spacers that are not covered by the mask layer. After the mask layer is removed, a dielectric layer is formed over the substrate covering the gate structures. A self-aligned contact-hole is formed in the dielectric layer. A conductive layer is formed in the self-aligned contact hole and on the dielectric layer. Since the cap layer and spacers that are not covered by the mask layer are removed and substituted by the dielectric layer having lower dielectric constant property, the parasitic capacitance can be reduced.

4 Claims, 16 Drawing Sheets

SEMICONDUCTOR DEVICE HAVING A LOWER PARASITIC CAPACITANCE

CROSS REFERENCE TO RELATED APPLICATIONS

This application claims the priority benefit of Taiwan application Ser. No. 92123253, filed Aug. 25, 2003.

BACKGROUND OF INVENTION

1. Field of the Invention

The present invention relates to a semiconductor device and a fabrication method thereof. More particularly, the present invention relates to a semiconductor device having a lower parasitic capacitance and a manufacturing method thereof.

2. Description of Related Art

Along with the advancement of the semiconductor technology, device dimension continues to decrease. As semiconductor devices enter the deep sub-micron processing and integration of integrated circuits increases, the wafer surface is insufficient to provide enough space for the fabrication of the required interconnects. In order to accommodate the increase of interconnects due to a diminution of the device dimension, the multi-layer metal interconnects design with two layers or more is the technique used in the Very Large Scale Integrated (VLSI) circuits.

However, during the complicated interconnection design of a multi-layer interconnect, parasitic capacitance is often generated in a structure having a dielectric layer sandwiched between two conductive structures. For example, in a memory device, after forming the gate structure, a dielectric layer is normally formed to cover the gate structure, followed by forming a bit line on the dielectric layer. As a result, parasitic capacitance is generated due to the bit-line coupling effect between the bit line and the gate structure.

The presence of the above parasitic capacitance would result in signal noise, adversely affecting the effectiveness of the device. To mitigate the parasitic capacitance in integrated circuits is an imminent problem needs to be readily resolved.

SUMMARY OF INVENTION

Accordingly, the present invention provides a semiconductor device and a fabrication method thereof, wherein parasitic capacitance, which is normally generated in the conventional integrated circuits, is alleviated.

The present invention also provides a semiconductor device and a fabrication method thereof, wherein the parasitic capacitance generated due to the bit-line coupling effect in a semiconductor device is mitigated.

The present invention provides a fabrication method for a semiconductor device, wherein this method includes forming a gate dielectric layer on a substrate. A plurality of gate structures is formed on the substrate, wherein each gate structure comprises a gate conductive layer, a cap layer and a spacer. Thereafter, a mask layer is formed on the substrate, covering a portion of the gate structures, wherein the mask layer covers the gate structures where the predetermined self-aligned contact is subsequently formed or the gate structures on the active region. The mask layer can also cover only parts of the gate structures. Thereafter, the cap layer and the spacer of the gate structure not covered by the mask layer are removed. After the removal of the mask layer, a dielectric layer is formed over the substrate to cover the gate structure. A self-aligned contact is further formed in the dielectric layer, and a conductive line is formed on the dielectric layer to electrically connect with the self-aligned contact.

The present invention also provides a fabrication method for a semiconductor device. The method includes providing a gate dielectric layer on a substrate, and a plurality of the gate structures is formed on the substrate. Each gate structure includes a gate conductive layer, a cap layer and a spacer. A first dielectric layer is further formed to fill the space between the gate structures, followed by forming a mask layer on the first dielectric layer to cover portions of the gate structure, wherein the mask layer covers the gate structures where the predetermined self-aligned contact is subsequently formed or the gate structures on the active region. The cap layer of the gate structure or the cap layer and the spacer not covered by the mask layer are removed. Subsequent to the removal of the mask layer, a second dielectric layer is deposited on the first dielectric layer. Thereafter, a self-aligned contact is formed in the first and the second dielectric layers, and a conductive line is formed on the second dielectric layer to electrically connect with the self-aligned contact.

The present invention further provides a fabrication method for a semiconductor device, wherein the method includes forming a gate dielectric layer on a substrate. A plurality of gate structures is formed on the gate dielectric layer, wherein each gate structure includes a gate conductive layer, a cap layer and a spacer. Thereafter, a first dielectric layer is formed filling the gate structures therebetween, and a self-aligned contact is formed in the dielectric layer between two of the gate structures. The cap layer of all the gate structures or the cap layer and the spacer of all gate structures are removed. A second dielectric layer is then deposited on the first dielectric layer, and a conductive line is formed on the second dielectric layer to electrically connect with the self-aligned contact.

The present invention provides a semiconductor device, wherein the device includes a gate dielectric layer, a plurality of first gate structures, a plurality of second gate structures, a dielectric layer, a self-aligned contact and a conductive line. The gate conductive layer is disposed on a substrate. The first gate structures are disposed on the gate dielectric layer, wherein each of the first gate structures includes a gate conductive layer, a cap layer and a spacer. The second gate structures are disposed on the substrate, wherein each of the second gate structures includes a gate conductive layer. The dielectric layer is disposed on the substrate, covering the first and the second gate structures. The self-aligned contact is disposed in the dielectric layer between the first gate structures. The conductive line is disposed on the dielectric layer and is electrically connected with the self-aligned contact.

In one embodiment of the invention, the cap layer and the spacer of the first gate structures are disposed only between the self-aligned contact and the gate conductive layer. In another embodiment of the present invention, the dielectric layer at the sidewall of the gate conductive layer of the second gate structures comprises voids therein. In another embodiment of the invention, the dielectric layer at the sidewall of the first gate conductive layer that is not adjacent to the self-aligned contact comprises voids therein. In another embodiment of the invention, the second gate structure further includes a spacer that is higher than the gate conductive layer, wherein the spacer is disposed on the sidewall of the gate conductive layer.

The present invention further provides a semiconductor device, which includes a gate dielectric layer, a plurality of first gate structures, a plurality of second gate structures, a dielectric layer, a self-aligned contact and a conductive line. The gate dielectric layer is disposed on the substrate. The first gate structures are disposed on the gate dielectric layer, and each of the first gate structures includes a gate conductive layer, while the second gate structures are disposed on the substrate, and each of the second gate structures includes a gate conductive layer. Further, the dielectric layer is disposed on the substrate, covering the first and the second gate structures. The self-aligned contact is disposed in the dielectric layer between the first gate structures. Moreover, the self-aligned contact and the first gate structure include the dielectric layer therebetween. The conductive line is disposed on the dielectric layer and is electrically connected with the self-aligned contact. In one aspect of the invention, the dielectric layer between the sidewalls of the gate conductive layer of the first and the second gate structures includes voids therein. In another aspect of the invention, the first and the second gate structures further include a spacer on the sidewall of the gate conductive layer, wherein the spacer is higher than the gate conductive layer.

In accordance to the present invention, the cap layer and the spacer with a higher dielectric constant are removed. Further, where the cap layer and the spacer are previously occupied, a low dielectric constant material is formed to lower the parasitic capacitance of the integrated circuits.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

First Embodiment

Figure 9:
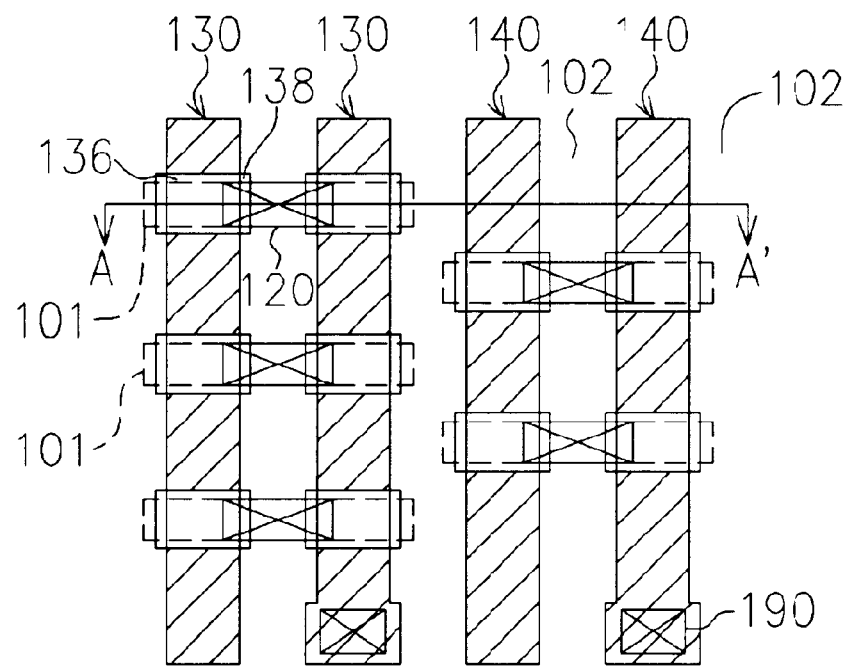
FIG. 9 is schematic, top view diagram of a semiconductor device according to the first embodiment of the present invention.

FIGS. 1A to 1D are schematic, cross-sectional view diagrams illustrating the fabrication process for a semiconductor device according to the first embodiment of the present invention. FIG. 9 is a schematic, top view diagram of the semiconductor device in the first embodiment of the present invention. The present invention can be better understood by way of the following description of using a memory device, which is not to be construed as only applicable to memory devices.

Figure 1A:
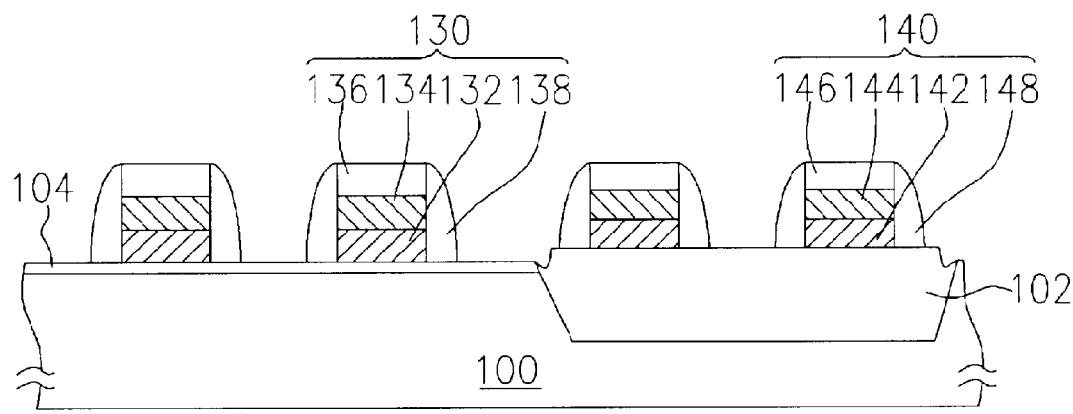
FIGS. 1A to 1D are schematic, cross-sectional view diagrams illustrating the fabrication process for a semiconductor device according to the first embodiment of the present invention.

Referring to both FIG. 1A and 9, a shallow trench region 102 is formed in a substrate 100 to define an active region 101. The isolation region 102 is, for example, a shallow trench isolation region. Thereafter, a thin oxide layer 104 is formed on the surface of the substrate 100 to serve as a gate dielectric layer subsequently. A plurality of gate structures 130, 140 is formed on the substrate 100, wherein the gate structures 130 are formed on the active region 101, while the gate structures 140 are formed on the isolation region 102. The aforementioned gate structures 130, 140 are formed with polysilicon layers 132, 142, metal silicide layers 134, 144, cap layers 136, 146 and spacers 138, 148, respectively, wherein the cap layers 136, 146 and the spacers 138, 148 are formed with, for example, silicon nitride. Further, depending on the process, a silicon oxide liner (not shown) is further formed on the sidewalls of the polysilicon layers 132, 142 and the metal silicide layers 134, 144 before spacers 138, 148 formed.

Figure 1B:
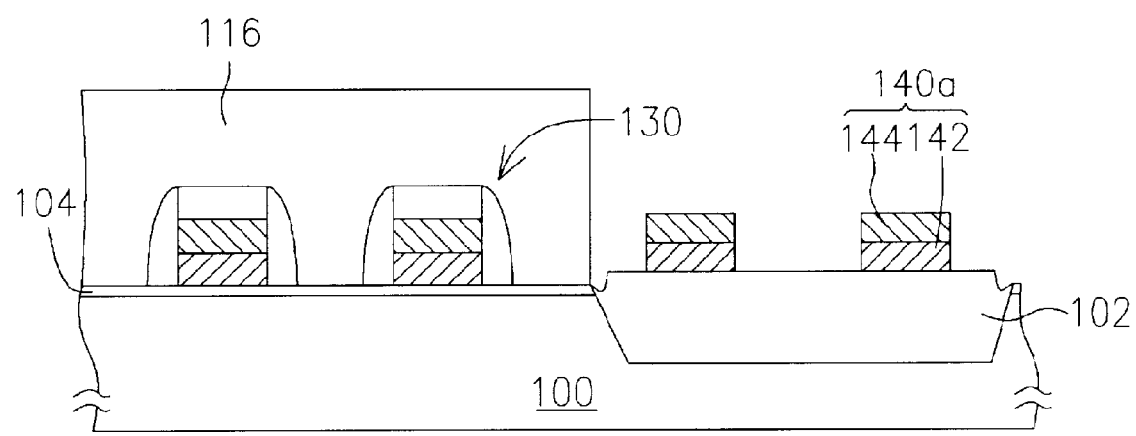

Referring to FIG. 1B, a mask layer 116 is formed on the substrate 100, covering the gate structures 130 on the active region 101. In this embodiment of the invention, the mask layer 116 is, for example, a photoresist layer. Further, underneath the photoresist layer can also include an anti-reflection layer. The mask layer 116 covers the gate structures 130 and the predetermined site for a subsequently formed self-aligned contact between the gate structures 130.

An etching process is then performed to remove the cap layers 146 and the spacers 148 that are not covered by the mask layer 116, leaving only the polysilicon layers 142 and the metal silicide layers 144 to form the gate structures 140a as shown in the top view diagram of FIG. 9. In FIG. 9, the cap layers 136 and the spacers 138 of the gate structures 130 disposed on the active region 101 are retained, while the cap layers 146 and the spacers of the gate structures 140 disposed on the isolation region 102 are removed. For the etchant used in the etching process, the etching selectivity ratio of the cap layer 146 and the spacer 148 to the gate dielectric layer 104 and gate conductive layer (polysilicon layer 132, 142 and metal silicide layer 134, 144) is at least greater than 10. In one aspect of the invention, the etching process can be a wet etch process using, for example, a phosphoric acid as an etchant or a dry etch process using, for example, $CHF_3/O_2$ or $CH_2F_2$ as a reaction gas.

It is important to note that the above process step to remove the cap layers 146 and the spacers 148 can be incorporated with the manufacturing process of the gate contact. In other words, as shown in FIG. 9, a slight modification to the mask used for the gate contact manufacturing process can have the cap layers at the predetermined gate contact 190 region and the aforementioned cap layers 146 and spacers 148 concurrently removed.

Figure 1C:
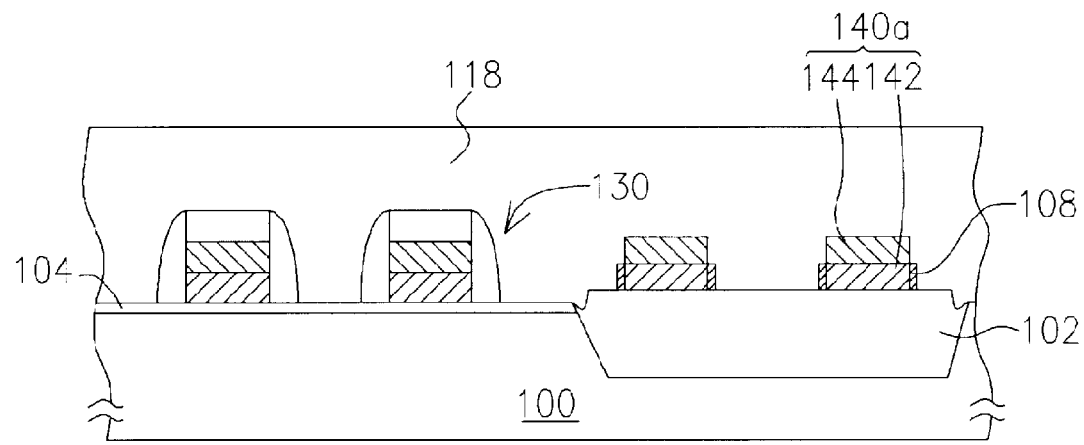

As shown in FIG. 1C, after the mask layer 116 is removed, a dielectric layer 118 is deposited over the substrate 100 to cover the gate structures 130 and the gate structures 140a. More specifically, the dielectric constant of the dielectric layer 118 is lower than the dielectric constant of silicon nitride. The dielectric layer 118 is, for example, silicon oxide, doped silicon oxide or other low dielectric constant dielectric layer.

It is important to note that due to higher step height for the isolation region 102 than the active region 101, the deposited thickness of the gate conductive layer (the polysilicon layers 142 and the metal silicide layers 144) formed on the isolation region 102 is thinner than that of the gate conductive layer (polysilicon 132 and metal silicdie 134) formed on the active region 101. The resistance of the gate structure on the isolation region is thus higher. In this aspect of the invention, since the cap layer 146 and the spacer 148 of the gate structure on the isolation region are removed, a metal silicide layer 108 can be formed, such as by a self-aligned silicide (Salicide) process, on the sidewall of the polysilicon layer 142 to reduce the resistance of the gate structures 140a.

Figure 1D:
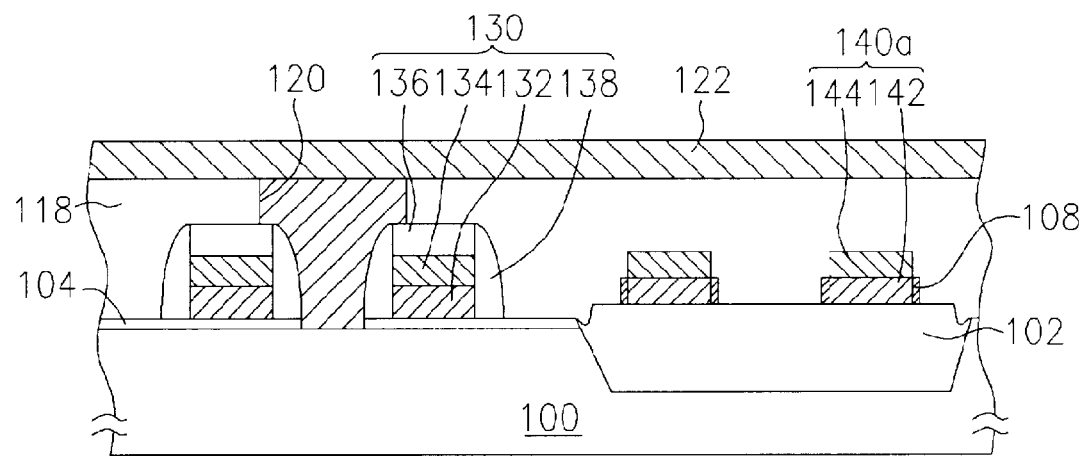

Referring to FIG. 1D, a self-aligned contact 120 is formed in the dielectric layer 118, and a bit line 122 is formed on the dielectric layer 118, wherein the bit line 122 extends across over the gate structures 130 and the gate structures 140a and is electrically connected with the self-aligned contact 120.

In this invention, the cap layers 146 and the spacers 148 of the gate structures 140 are removed. Instead, the cap layer 146 and the spacer 148 are replaced by a low dielectric constant dielectric layer 118. Therefore, in accordance to the present invention, the parasitic capacitance generated due to the coupling between the bit line 122 and the gate structures 140 can be mitigated.

Still referring to FIG. 1D, the semiconductor device of the present invention further comprises a gate dielectric layer 104, a plurality of gate structures 130, a plurality of gate structures 140a, a dielectric layer 118, a self-aligned contact 120 and a conductive line 122. The gate dielectric layer 104 is disposed on the substrate 100. The gate structures 130 are disposed on the gate dielectric layer 104, wherein the gate structures 130 are constructed with the gate conductive layers 132, 134, the cap layer 136 and the spacer 138. The gate structures 140a are disposed on the substrate 100. Further, the gate structures 140a are constructed with the gate conductive layers 142, 144. The dielectric layer 118 is disposed on the substrate 100, covering the gate structures 130, 140a. The self-aligned contact 120 is disposed in the dielectric layer 118 between the gate structures 130, while the conductive line 122 is disposed on the dielectric layer 118 and is electrically connected with the self-aligned contact 120. In one aspect of the invention, the sidewall of the gate conductive layer 142 of the gate structure 140a further includes a metal silicide layer 108 formed thereon.

In additional to the removal of the spacer and the cap layer of the gate structures that are disposed on the isolation region to mitigate parasitic capacitance, the present invention further includes a removal of a part of the cap layer and the spacer of the gate structures that are disposed on the active region in another aspect of the invention. Consequently, as detailed in the following, parasitic capacitance generated due to the bit line coupling effect is reduced.

Figure 2A:
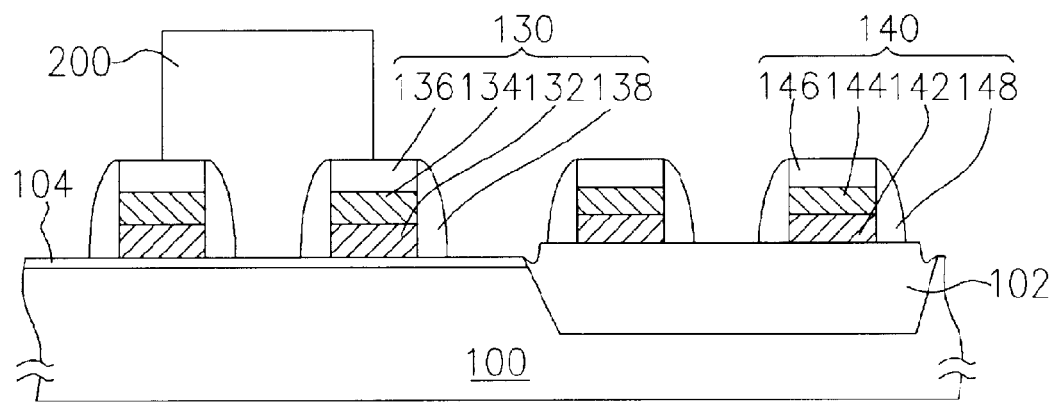
FIGS. 2A to 2D are schematic, cross-sectional view diagrams illustrating the fabrication process for a semiconductor device according to the another aspect of the first embodiment of the present invention.
Figure 10:
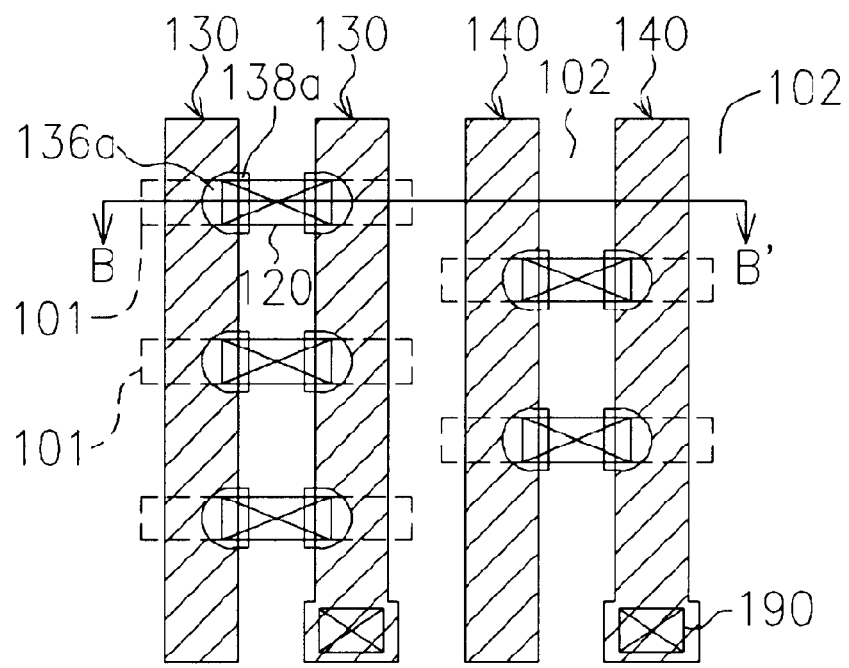
FIG. 10 is schematic, top view diagram of a semiconductor device according to another aspect of the first embodiment of the present invention.

Referring to FIG. 2A and FIG. 10, similar to the process steps that are being described in FIG. 1A, an isolation region 102 is formed in the substrate 100 to define an active region 101. After forming the dielectric layer 104 on the substrate 100, gate structures 130, 140 are formed on the substrate 100. A mask layer 200 is further formed over the substrate 100 to cover a part of the active region 101, including portions of the gate structures 130. In other words, the mask layer 200 covers the cap layer 136 and the spacer 138 where the self-aligned contact is subsequently formed.

Figure 2B:
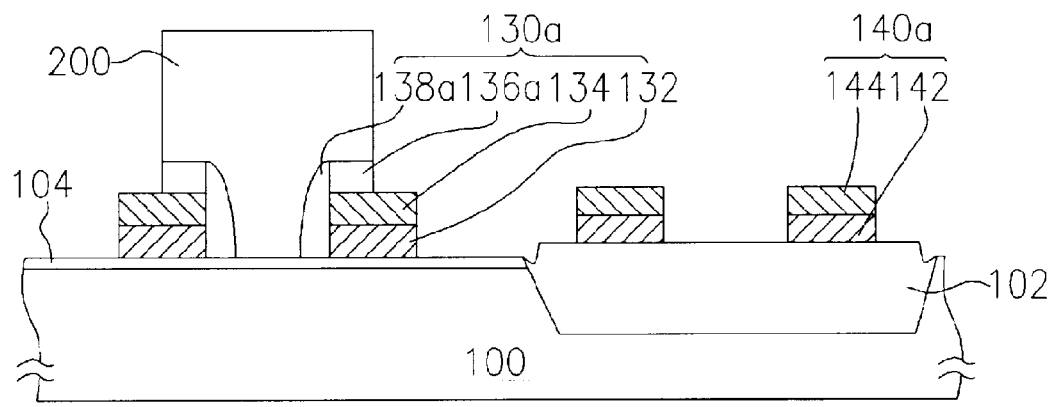

Continuing to FIG. 2B, an etching process is conducted to remove the cap layer 146 and the spacer 148, and portions of the cap layer 136 and the spacer 138, leaving only the cap layer 136a and the spacer 138a, where the predetermined self-aligned contact is going to be formed. Consequently, gate structures 130a and gate structures 140a are formed. As shown in FIG. 10, the gate structures 130a disposed on the active region include only the remaining portion of the cap layer 136a and the spacer 138a. The etching parameters are similar to those of the etching process as described in FIG. 1B. If a wet etching process is conducted, the undercut problem created due to the removal of the cap layer 136 needs to be considered. However, a slight modification to coverage area of the mask layer 200 can easily resolve such problem.

Similarly, the process step in removing the cap layer 146 and the spacer 148, and the portions of the cap layer 136 and the spacer 138 can be combined in the gate contact processing step. In other words, as showing FIG. 10, by slightly modifying the photomask used in the gate contact fabrication process, the cap layer where the contact 190 is going to be formed is removed, while the cap layer 146 and the spacer 148, and portions of the cap layer 136 and the spacer 138 are concurrently being removed.

Figure 2C:
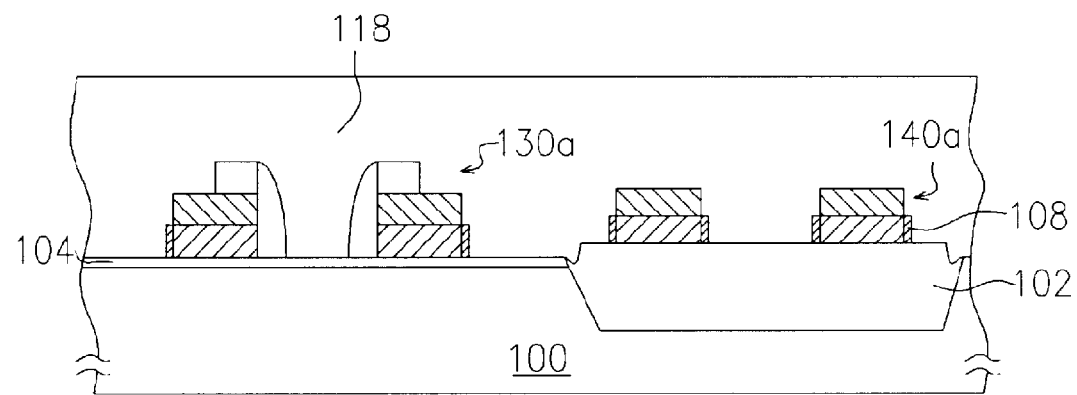

As shown in FIG. 2C, after removing the mask layer 200, a dielectric layer 118 is deposited on the substrate 100, covering the gate structures 130a and gate structures 140a. Thereafter, as shown in FIG. 2D, a self-aligned contact 120 is formed in the dielectric layer 118 and a bit line 122 is formed on the dielectric layer 118.

Similarly, after removing the mask layer 200, in this aspect of the invention, a metal silicide process is further conducted to form a metal silicide layer 108 on the sidewalls of the polysilicon layers 132, 142 to lower the resistance of the gate structures 130a, 140a.

In this aspect of the invention, beside removing the cap layer 146 and the spacer 148 of the gate structures 140, portions of the cap layer 136 and the spacer 136 of the gate structures 130 are also removed. Therefore, after forming the lower dielectric constant dielectric layer 118, parasitic capacitance generated due to the coupling of the bit line 12 and the gate structures 130, 140 are reduced.

Figure 2D:
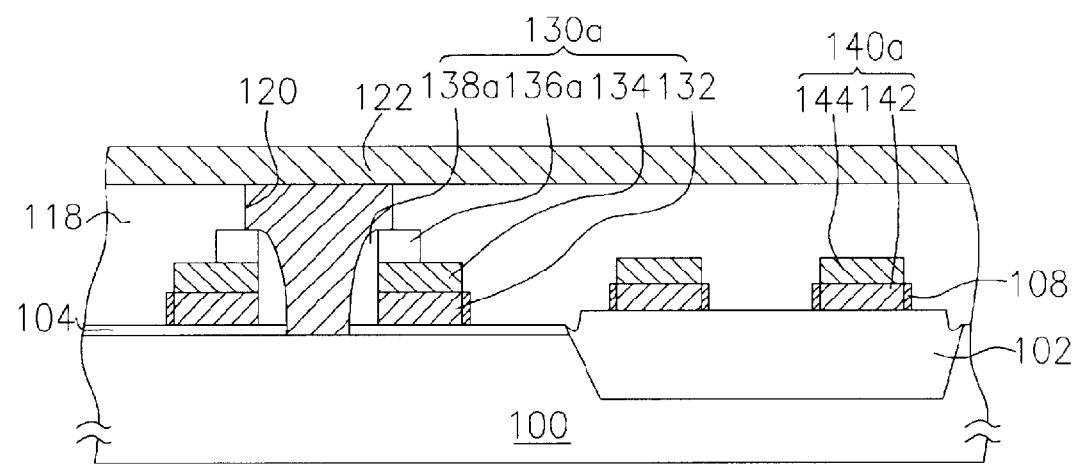

Continuing to FIG. 2D, the structure of the semiconductor device in this aspect of the invention is similar to that illustrated in FIG. 1D. A difference between the two structures is that the gate structures 130a comprise the gate conductive layers 132, 134, the cap layer 136a and the spacer 138a, wherein the cap layer 136a and the spacer 138a of the gate structures 130a are disposed between the self-aligned contact 120 and the gate conductive layers 132, 134.

Second Embodiment

FIGS. 3A to 3D are schematic, cross-sectional views illustrating the fabrication process of a semiconductor device according to a second embodiment of the invention.

Figure 3A:
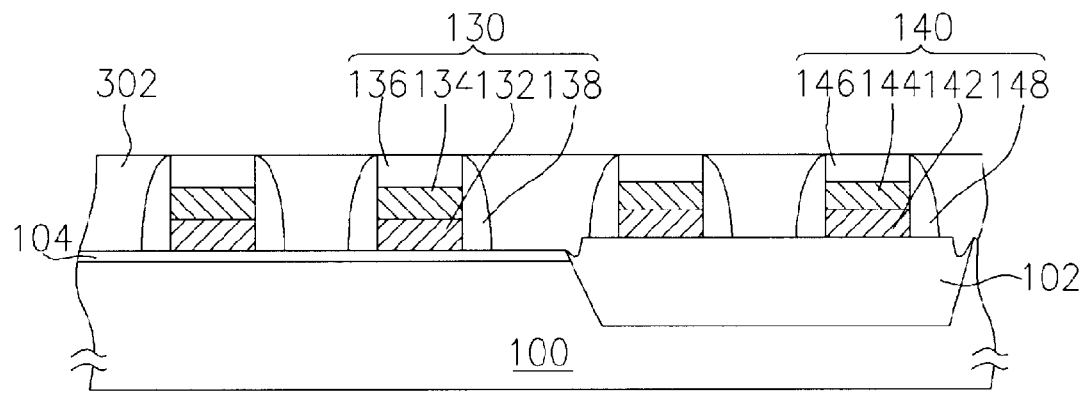
FIGS. 3A to 3D are schematic, cross-sectional view diagrams illustrating the fabrication process for a semiconductor device according to the second embodiment of the present invention.

As shown in FIG. 3A, the processing steps similar to those illustrated in FIG. 1A are performed. Thereafter, a dielectric layer 302 is formed filling the space between the gate structures 130, 140. Forming the dielectric layer 302 is by, for example, depositing a dielectric material layer (not shown) on the substrate 100 to cover the gate structures 130, 140, followed by performing a chemical mechanical polishing process or an etching back process until the cap layers 136, 146 are exposed.

Figure 3B:
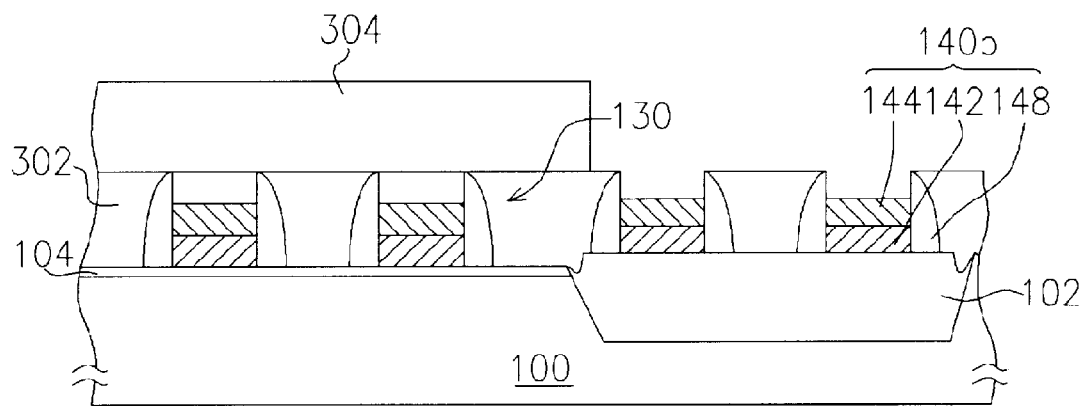

Referring to FIG. 3B, a mask layer 304 is formed on the dielectric layer 302, covering the gate structures 130 on the active region 101. In one aspect of the invention, the mask layer 304 is, for example, a photoresist layer, wherein under the photoresist layer further includes an anti-reflection layer (not shown). This mask layer 304 covers the gate structures 130 on the active region or the region between the gate structures 130 where the self aligned contact is going to be formed subsequently.

A dry etching process is performed to remove the cap layer 146 that is not covered by the mask layer 304, leaving behind the spacer 146, the polysilicon layer 142 and the metal silicide layer 144 to form the gate structures 140b. The etching selectivity between the cap layer and the gate conductive layer of the etchant used is at least greater than 10. For example, the etching selectivity ratio of silicon nitride to metal silicide is at least greater than 10. In one aspect of the invention, the reaction gas used in the dry etching process is, for example, $CHF_3/O_2$ or $CH_2F_2$.

Figure 11:
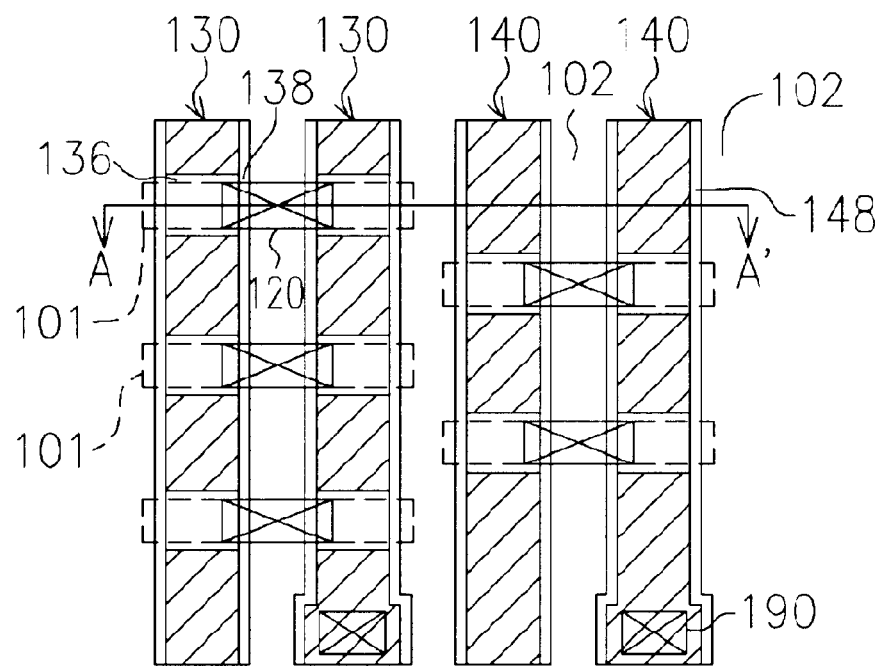
FIG. 11 is schematic, top view diagram of a semiconductor device according to the second embodiment of the present invention.

It is important to note that, the cap layer 146 removal process can be combined with the gate contact manufacturing process. In other words, as shown in FIG. 11, by slightly modifying the photomask used in the gate contact manufacturing process, the above-mentioned cap layer 146 can also be removed during the removal of the cap layer 146 where the gate contact 190 is going to be formed.

Figure 3C:
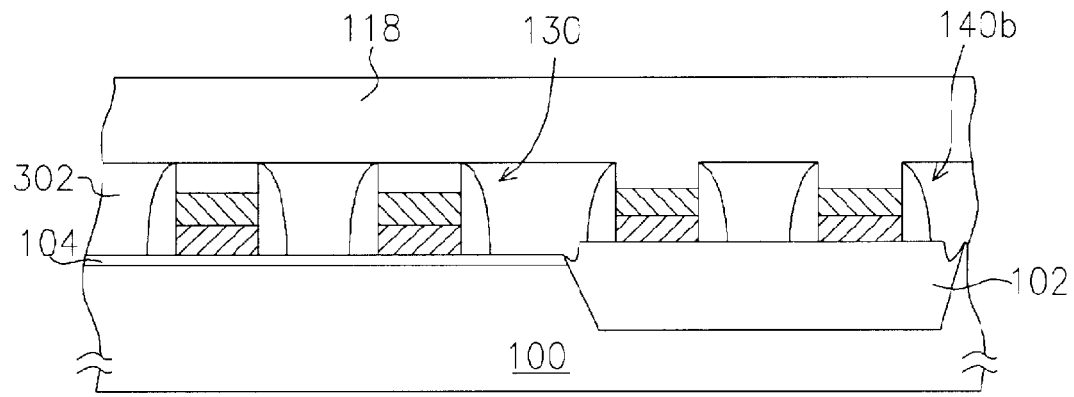

As shown in FIG. 3C, after removing the mask layer 304, a dielectric layer 118 is deposited above the dielectric layer 302, covering the gate structures 130 and gate structures 140b. More particularly, the dielectric constant of the dielectric layer 118 is lower than that of silicon nitride. The dielectric layer 118 is, for example, silicon oxide, doped silicon oxide or low dielectric constant dielectric layer.

Figure 3D:
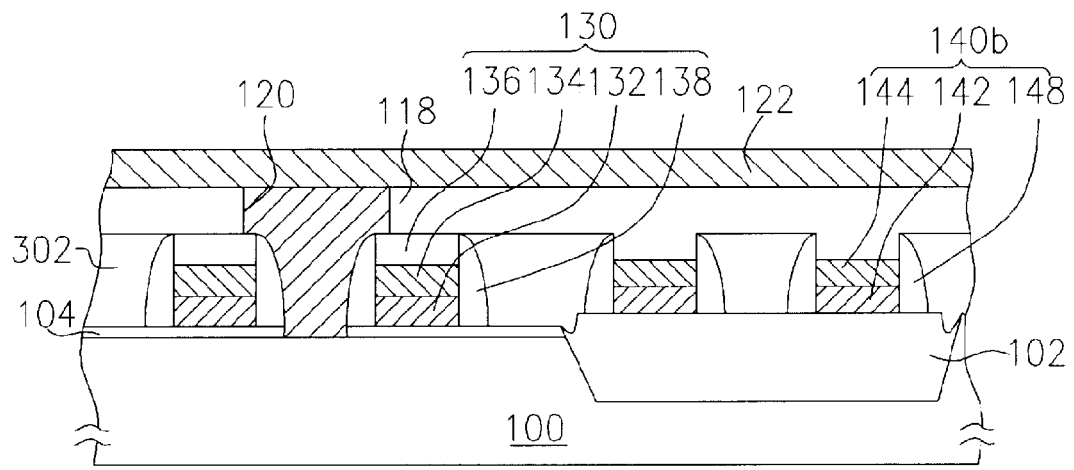

Continuing to FIG. 3D, a self-aligned contact 120 is formed in the dielectric layer 302 and the dielectric layer 118, and a bit line 122 is formed on the dielectric layer 118, wherein the bit line 122 extends across over the gate structures 130, 140b and electrically connects with the self-aligned contact 120.

Still referring to FIG. 3D, the structure of the semiconductor device is similar to that in FIG. 1D. A difference between the two structures is at the gate structures 140b, wherein beside having a spacer formed on the sidewalls of the gate structures 140b, which include the gate conductive layers 142, 144, the spacer 148 is higher than the gate conductive layers 142, 144. Further, the dielectric layer 302 between the gate structures 130, 140b and the dielectric layer 118 that covers the gate structures 130, 140b can be a same dielectric material or different dielectric materials.

Figure 4A:
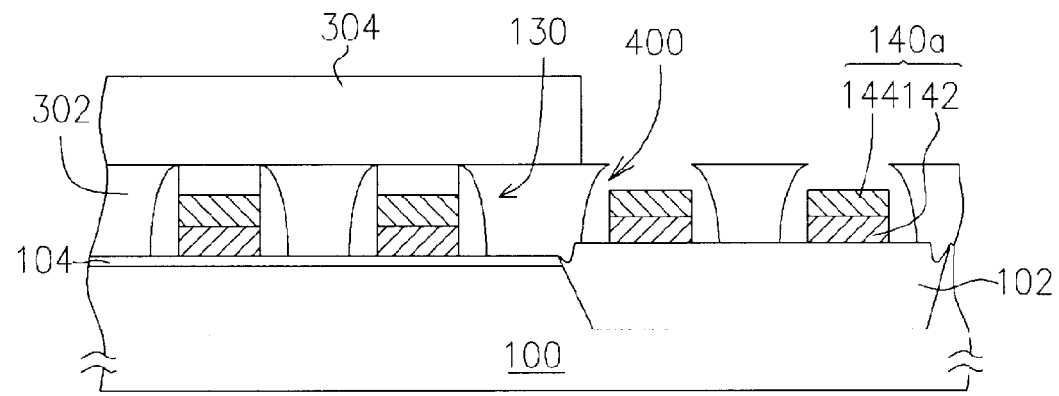
FIGS. 4A to 4C are schematic, cross-sectional view diagrams illustrating the fabrication process for a semiconductor device according to another aspect of the second embodiment of the present invention.

In another aspect of the invention, during the wet etching process as illustrated in FIG. 3B, beside removing the cap layer 146, the spacer 148 is also being removed as shown in FIG. 4A. Referring to FIG. 4A, the cap layer 148 and the spacer of the gate structures 140 are removed in the wet etching process. A gap 400 is thus formed between the sidewall of the gate structures 140a and the dielectric layer 302. This wet etching process uses, for example, phosphoric acid as an etchant.

Similarly, in this aspect of the invention, the process step for removing the cap layer 146 and the spacer 148 can be incorporated with the gate contact manufacturing process. As shown in the top view diagram in FIG. 9, by slightly modifying the photomask of the gate contact manufacturing process, the above-mentioned cap layer 146 and the spacer 148 can be concurrently removed during the removal of the cap layer where the gate contact 190 is going to be formed.

Figure 4B:
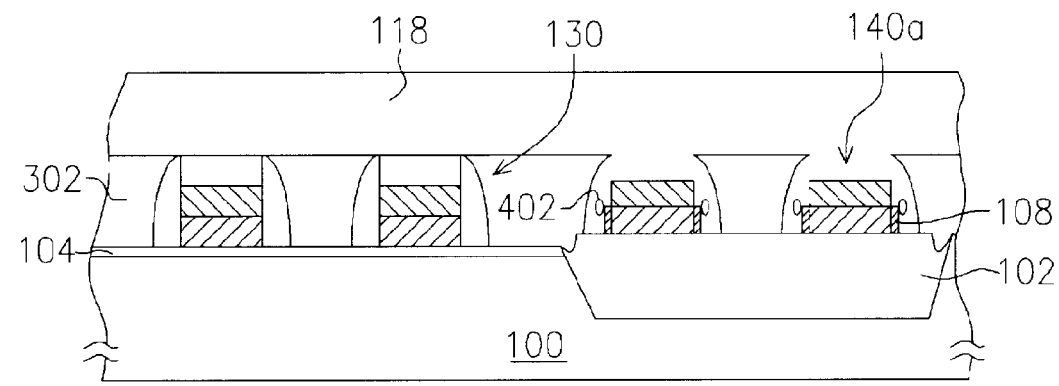

As shown in FIG. 4B, after the mask layer 304 is removed and a dielectric layer 118 is deposited on the dielectric layer 302, the gap 400 is filled with the dielectric layer 118 and voids are being formed. Similarly, in this aspect of the invention, after the removal of the mask layer, a metal silicide process may perform to form a metal silicide layer 108 on the sidewall of the polysilicon layer 142 to lower the resistance of the gate structures 140a. Thereafter, as shown in FIG. 4C, the self-aligned contact 120 and the bit line 122 are subsequently formed.

In this second embodiment of the present invention, the cap layer 146 or the cap layer 146 and the spacer 148 are removed to lower the parasitic capacitance generated from the bit line coupling effect. Moreover, if the cap layer 146 and the spacer 148 are removed, voids 402 are formed in the dielectric layer 118 that is being deposited in the gap 400. The presence of these voids 402 can lower the dielectric constant of the dielectric layer 118, which can further reduce the parasitic capacitance generated due to the bit line coupling effect.

Figure 4C:
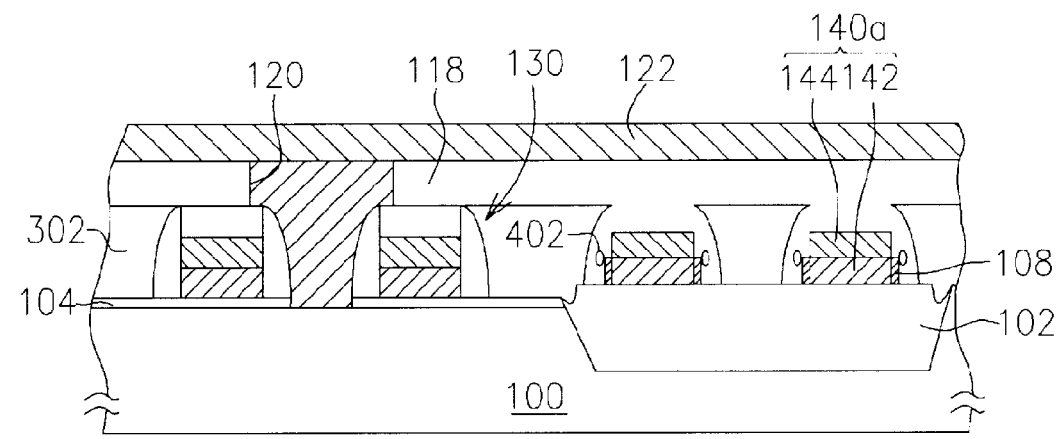

Referring to FIG. 4C, the semiconductor device formed in the above manufacturing process is similar to the device illustrated in FIG. 3D. A difference between the two devices is at the gate structures 140a, in which the gate structures 140a in the second embodiment include only the gate conductive layers 142, 144. Further, voids 402 are formed in the dielectric layer 118 at the side of the gate conductive layers 142, 144. In one aspect of the invention, a metal silicide layer is further formed on the sidewall of the gate conductive layer 142.

In the second embodiment of the invention, beside removing the spacer and the cap layer of the gate structures on the isolation region to mitigate the parasitic capacitance, portions of the cap layer and the spacer of the gate structures on the active region can also be removed to lower the parasitic capacitance generated due to the bit line coupling effect, as detailed in the following.

Figure 5A:
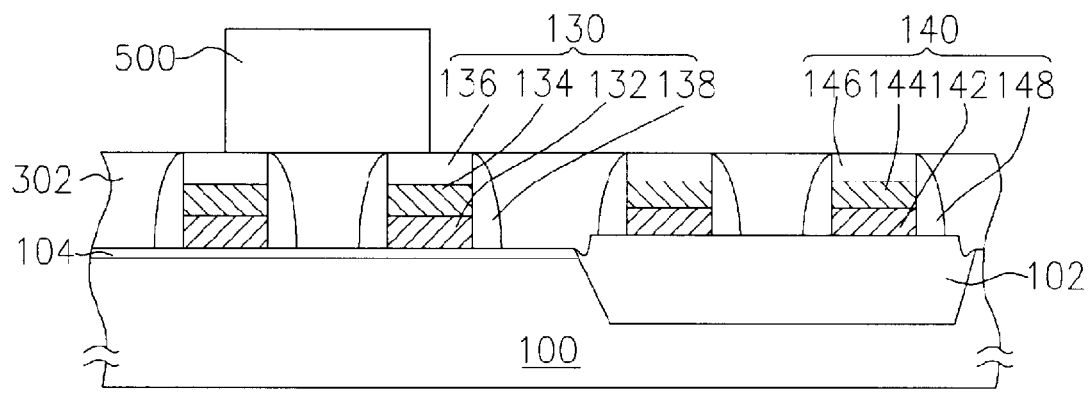
FIGS. 5A to 5D are schematic, cross-sectional view diagram illustrating the fabrication process for a semiconductor device according to yet another aspect of the second embodiment of the present invention.

Referring to FIG. 5A, similar to the process steps illustrated in FIG. 4A, an isolation region 102 is formed in the substrate 100. After forming the gate dielectric layer 104 on the substrate 100, gate structures 130, 140 are formed on the substrate 100. A dielectric layer 302 is further formed to fill the space between the gate structures 130, 140. Thereafter, a mask layer 500 is formed on the dielectric layer 302, covering portions of the gate structures 130. More specifically, the mask layer 500 covers the cap layer 136 and the spacer 138 where the self aligned contact is subsequently formed.

Figure 5B:
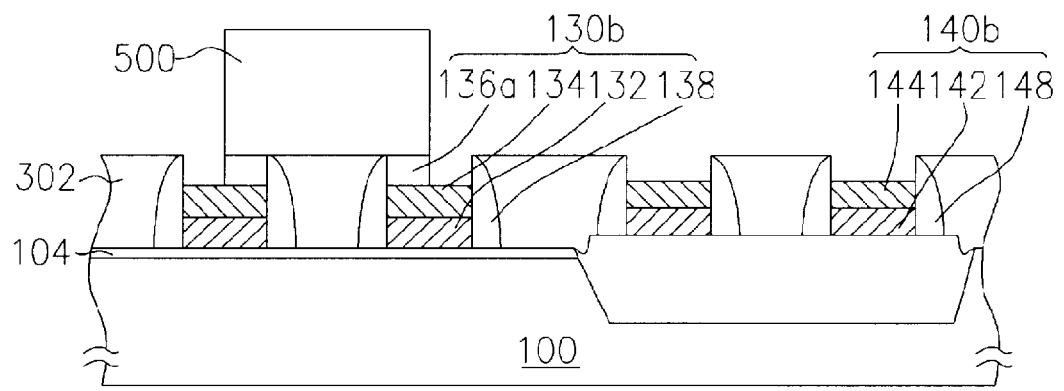
Figure 12:
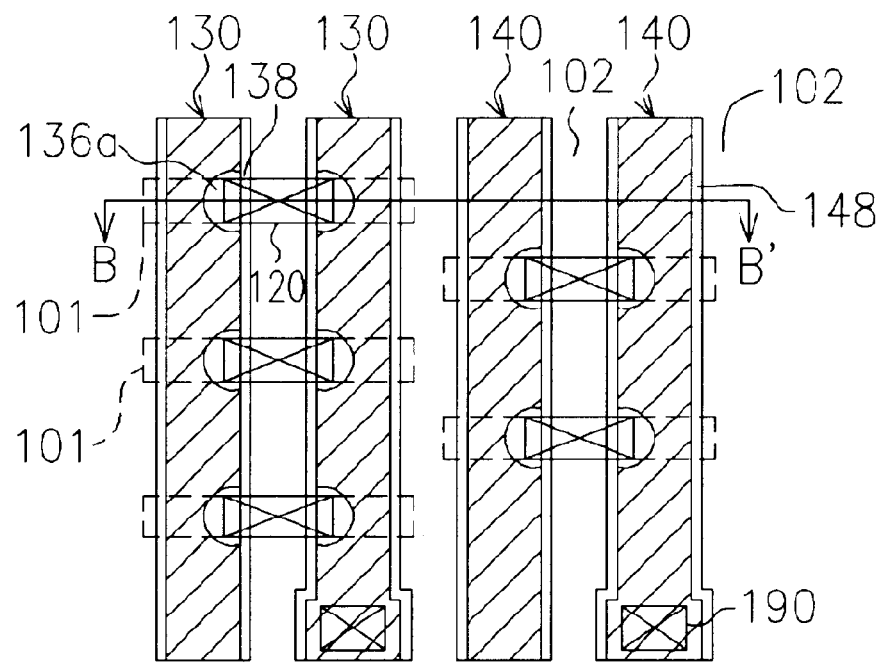
FIG. 12 is schematic, top view diagram of a semiconductor device according to another aspect of the second embodiment of the present invention.

As shown in FIG. 5B, a dry etching process is conducted to remove the cap layer 146 and a portion of the cap layer 136 not covered by the mask layer 500, leaving behind the cap layer 136a where the self-aligned contact is going to be formed. As a result, gate structures 130b and gate structures 140b are formed. Similarly, the process step for removing the cap layer 146 and the portion of the cap layer 136 can be incorporated with the manufacturing process in forming the gate contact. In other words, as shown in FIG. 12, the photomask used in the gate contact process can be modified slightly to have the cap layer at the predetermined gate contact 190 region removed during the removal of the above cap layer 146 and the portion of the cap layer 136.

Figure 5C:
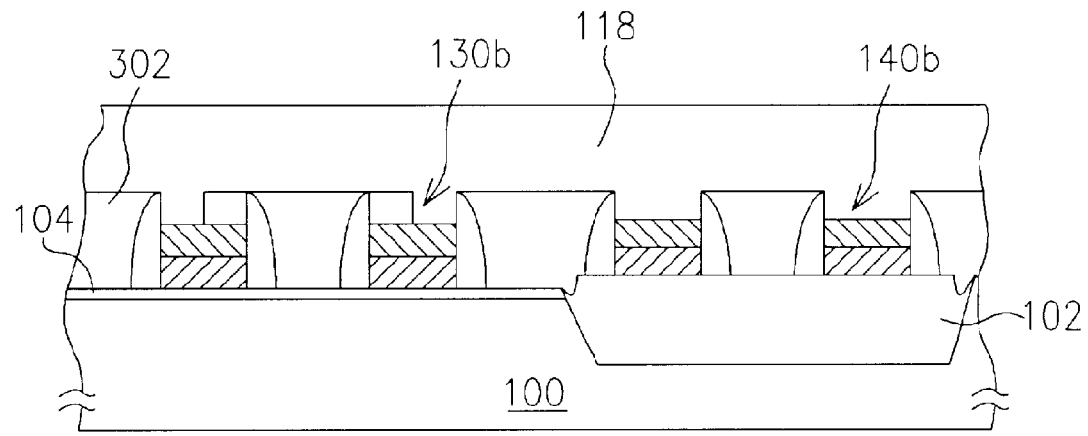

As shown in FIG. 5C, after removing the mask layer 500, a dielectric layer 118 is deposited over the substrate 100, covering the gate structures 130b and the gate structures 140b. Thereafter, as shown in FIG. 5D, a self-aligned contact 120 is formed in the dielectric layer and a bit line 122 is formed on the dielectric layer 118.

Figure 5D:
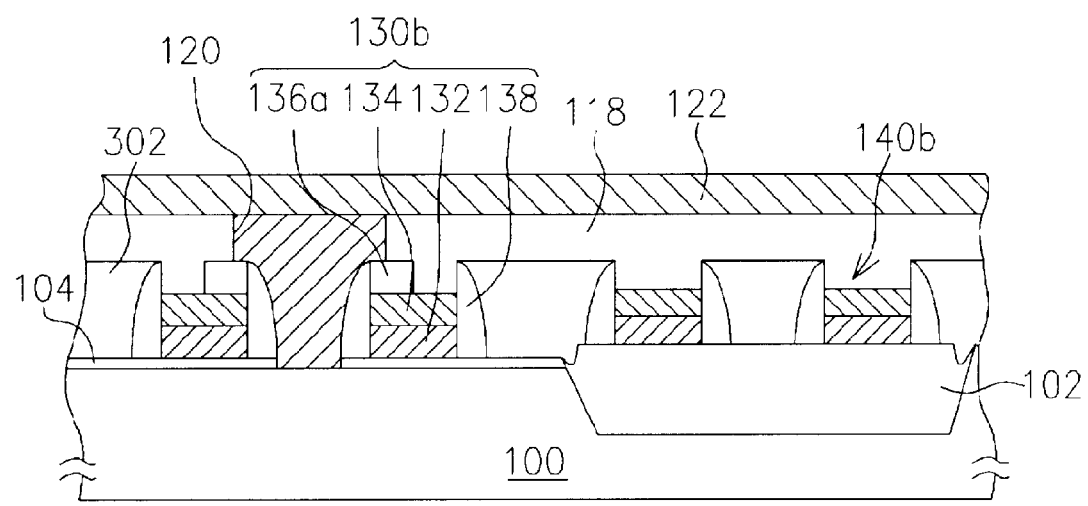

Continuing to FIG. 5D, the structure of the semiconductor device formed in the above process is similar to that in FIG. 3D. A difference between the two structures is at the gate structures 130b, wherein the gate structure 130b in the second embodiment include the gate conductive layer 132, 134, the cap layer 136a and the spacer 138.

Figure 6:
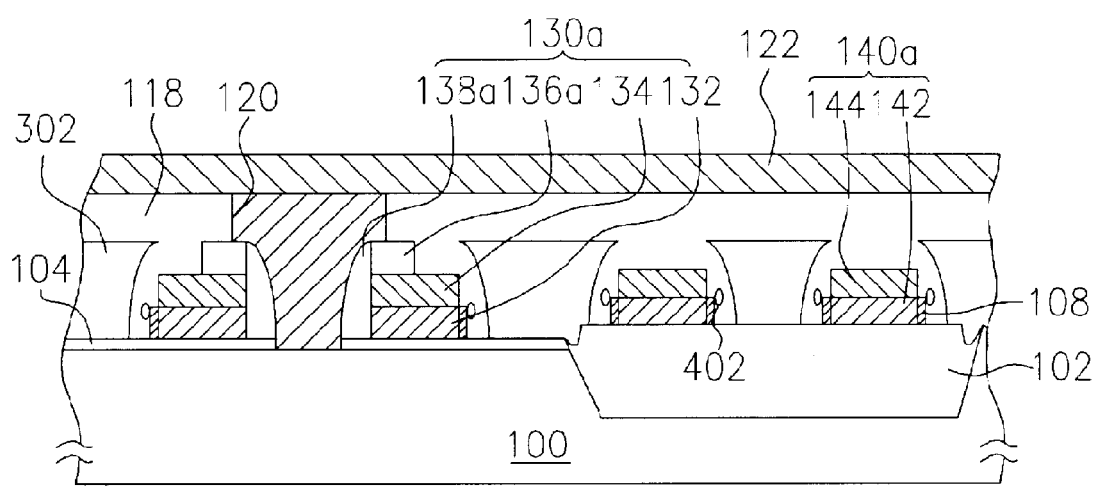
FIG. 6 is a schematic, cross-sectional view diagram of a semiconductor device according to yet another aspect of the second embodiment of the present invention.

In another aspect of this second embodiment of the invention, wet etching is performed in FIG. 5B to remove the cap layer 146, the spacer 148 and the portions of the cap layer 136 and the spacer 138, leaving only the cap layer 136a and the spacer 138 where the self-aligned contact is going to be formed to form the gate structures 130a and the gate structures 140a as shown in FIG. 6. Voids 402 are also formed in the dielectric layer 118 formed in the gap 400, wherein the presence of these voids 402 can lower the dielectric constant of the dielectric layer 118 to further reduce the parasitic capacitance generated due to the bit line coupling effect.

Similarly, after removing the mask layer 500, a metal silicide process can further performed to form a metal silicide layer 108 on the sidewall of the polysilicon layers 132, 142 to lower the resistance of the gate structures 130a, 140a.

Still referring to FIG. 6, the structure of the semiconductor device in this embodiment is similar to that in FIG. 4C. A difference between the two structures is at the gate structures 130a. The gate structures 130a include the gate conductive layers 132, 134, the cap layer 136a and the spacer 138a, wherein the dielectric layer 118 at the sidewall of the gate conductive layers 132, 134 that is not adjacent to the self-aligned contact 120 comprises voids 402. In another aspect of this embodiment of the invention, a metal silicide layer 108 is further formed on the sidewall of the gate conductive layer 142 and on the remaining sidewalls of the gate conductive layer 132 beside the sidewall that is adjacent to the self-aligned contact 120.

Third Embodiment

Figure 13:
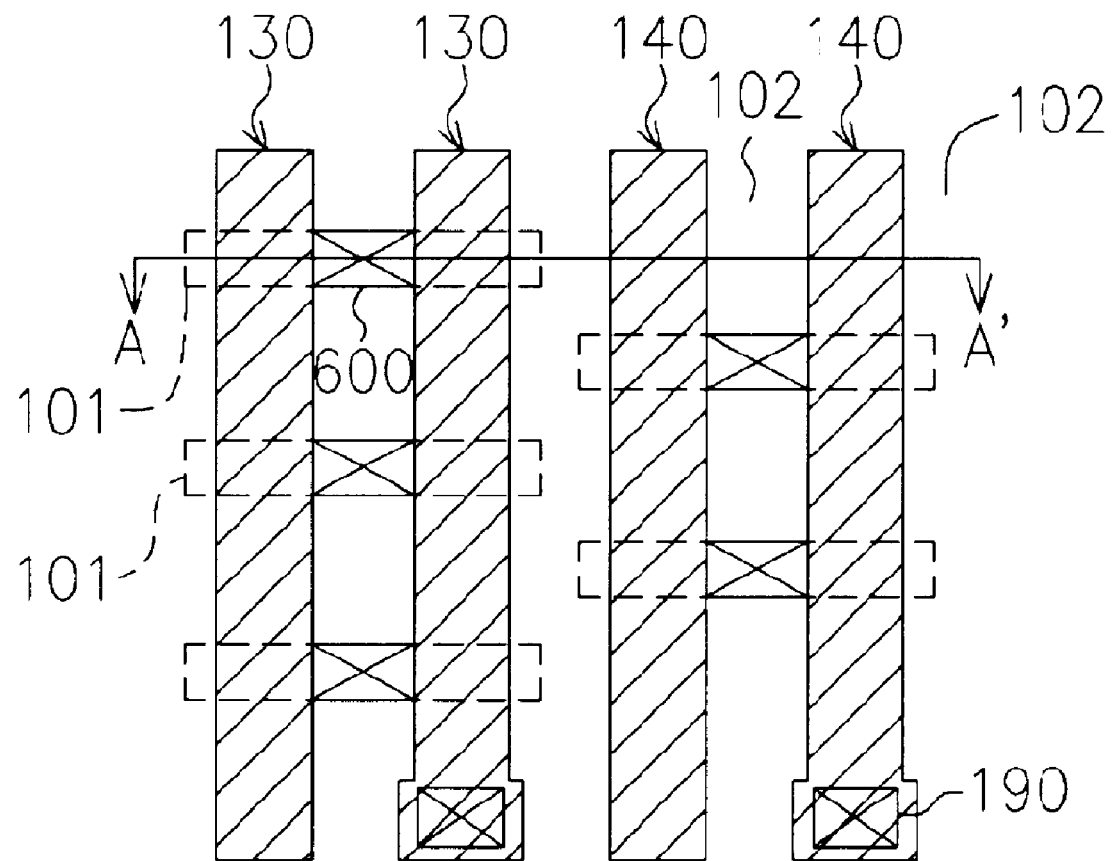
FIG. 13 is schematic, top view diagram of a semiconductor device according to the third embodiment of the present invention.

FIGS. 7A to 7D are schematic diagrams illustrating the fabrication process of a semiconductor device according to the third embodiment of the present invention. FIG. 13 is the top view diagram of the semiconductor device of the second embodiment of the invention.

Figure 7A:
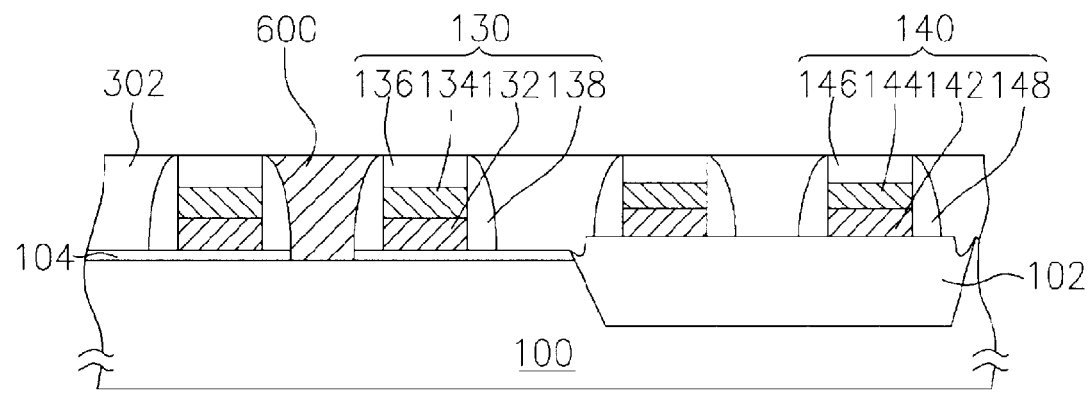
FIGS. 7A to 7D are schematic, cross-sectional view diagrams illustrating the fabrication process for a semiconductor device according to the third embodiment of the present invention.

Referring to FIG. 7A and 13, an isolation region 102 is formed in the substrate 100 to define the active region 101. Thereafter, a gate dielectric layer 104 is formed on the surface of the substrate 100, and gate structures 130, 140 are formed on the substrate 100, wherein the gate structures 130 are formed on the active region 101, while the gate structures 140 are formed on the isolation region 102. The above gate structures 130, 140 are each formed with the polysilicon layers 132, 142, the metal suicides 134, 144, the cap layers 136, 146 and the spacers 138, 148, wherein the cap layers 136, 146 and the spacer 138, 148 are formed with, for example, silicon nitride. Thereafter, a dielectric layer 302 is formed, filling the space between the gate structures 130, 140. The dielectric layer 302 is formed by depositing a dielectric material layer (not shown) on the substrate 100 to cover the gate structures 130, 140, followed by performing chemical vapor deposition process or an etching back process on the dielectric material layer until the cap layers 136, 146 are exposed.

Thereafter, a self-aligned contact 600 is formed in the dielectric layer 302. Forming the self-aligned contact 600 includes forming a self-aligned contact opening in the dielectric layer 302, followed by forming a conductive layer in the self-aligned contact opening.

Figure 7B:
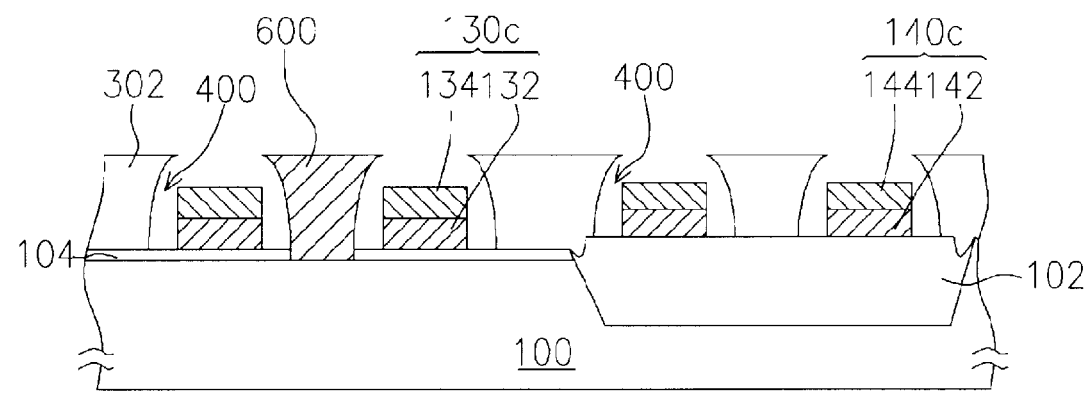

Referring to FIG. 7B, an etching process with etching selectivity ratio of the cap layer 136, 146 and the spacer 138, 148 to the gate dielectric layer 104 and gate conductive layer (polysilicon layer 132, 142 and metal silicide layer 134, 144) at least greater than 10, such as a wet etching process using a phosphoric acid as an etchant, is performed to remove the cap layers 136, 146 and the spacers 138, 148 of the gate structures 130, 140 to form the gate structures 130c 140a. A gap 400 is thus formed between the sidewalls of the gate structures 130c, 140a, and the dielectric layer 302.

Similarly, the process step in removing the cap layer 136, 146 and the spacer 138, 148 can be incorporated with the gate contact manufacturing process. In other words, as shown in FIG. 13, a slight modification to the photomask used in the gate contact opening manufacturing process can have the cap layer where the gate contact opening 190 is going to be formed removed, while con-currently removing the above-mentioned cap layers 136, 146, and the spacers 138, 148.

Figure 7C:
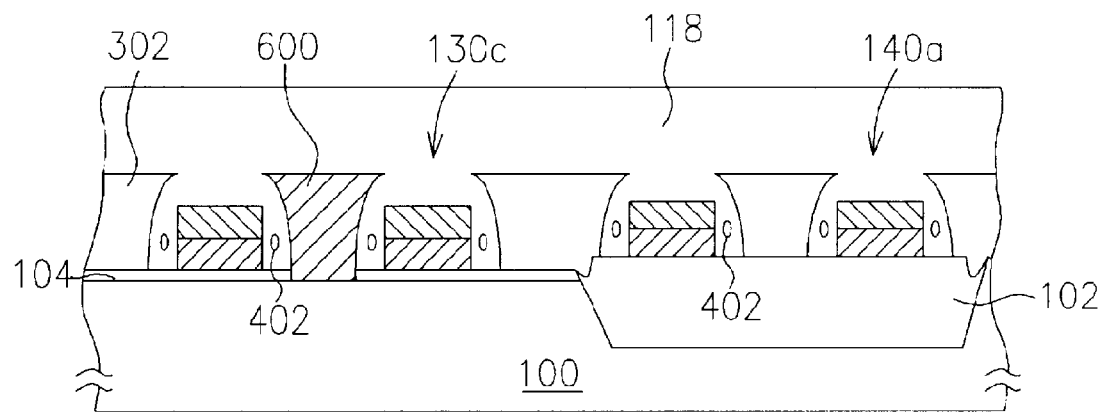

As shown in FIG. 7C, another dielectric layer 118 is deposited, filling the gap 400. Further, the dielectric layer 118 that fills the gap 400 is formed with voids 402. More particularly, the dielectric constant of the dielectric layer 118 is lower than that of silicon nitride. The dielectric layer 118 is, for example, silicon oxide, doped silicon oxide or low dielectric constant dielectric layer.

Figure 7D:
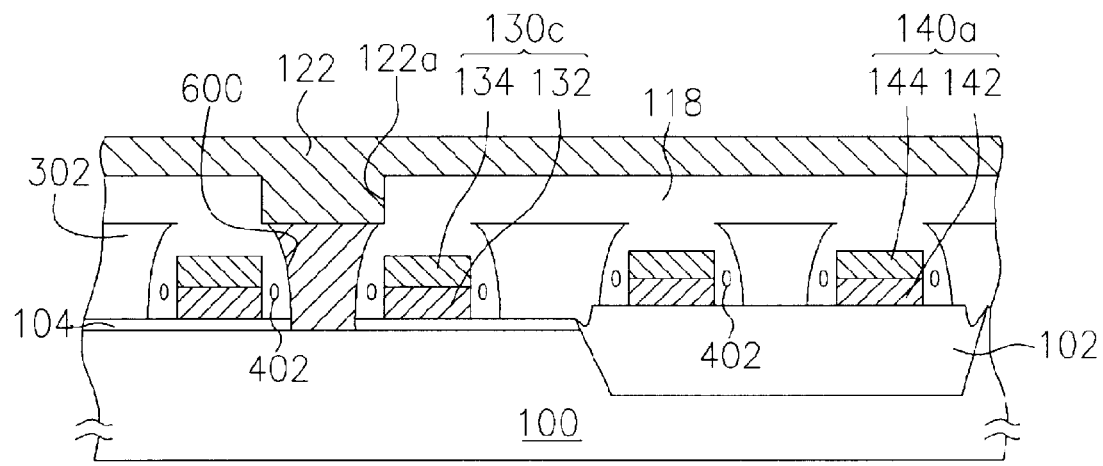

Referring to FIG. 7D, a bit line 122 is formed on the dielectric layer 118, and a contact opening 122a is formed in the dielectric layer 118, wherein the bit line 122 is electrically connected with the self-aligned contact 600.

Still referring to FIG. 7D, the semiconductor device of the present invention further includes a gate dielectric layer 104, a plurality of gate structures 130c, a plurality of gate structures 140a, dielectric layers 302, 118, a self-aligned contact 600 and a conductive line 122. The dielectric layer 104 is disposed on the substrate 100. The gate structures 130c are disposed on the gate dielectric layer 104, wherein the gate structures 130c are constructed with the gate conductive layers 132, 134. The gate structures 140a are disposed on the substrate 100, wherein the gate structures 140a are constructed with the gate conductive layers 142, 144. Further, the dielectric layers 118, 302 are disposed on the substrate 100, covering the gate structures 130c, 140a. The self-aligned contact 600 is disposed in the dielectric layer 302 between the gate structures 130c. The self-aligned contact 600 and the gate structures 130c further include a dielectric layer 118 therebetween. The conductive line 122 is disposed on the dielectric layer 118, and is electrically connected with the self-aligned contact 600 through the contact 122a. In one aspect of the invention, voids 402 are present in the dielectric layer 118 that is disposed between the sidewalls of the gate structures 130c and 140a.

Figure 8:
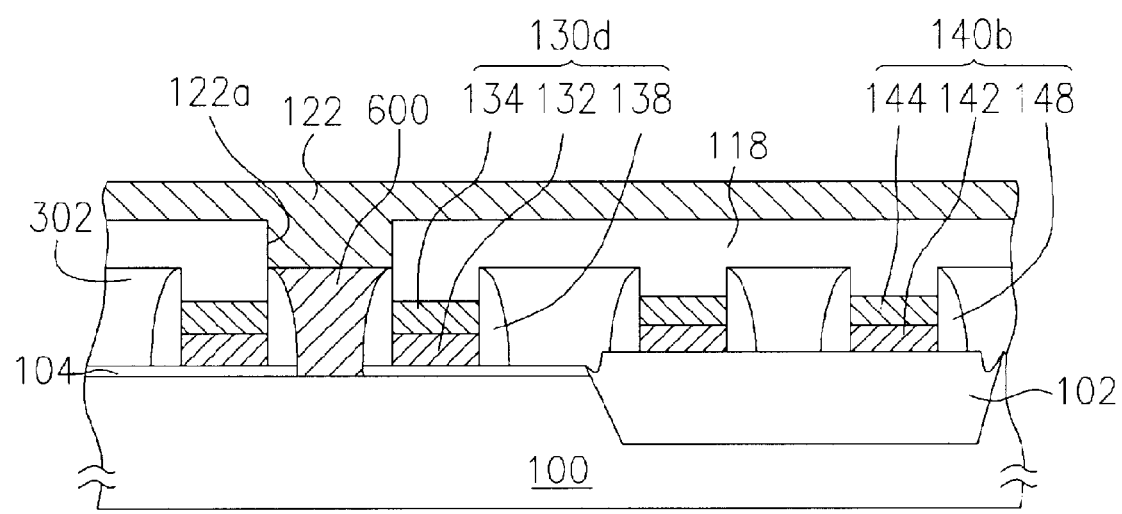
FIG. 8 is a schematic, cross-sectional view diagram of a semiconductor device according to another aspect of the second embodiment of the present invention.

In another aspect of the third embodiment of the invention, a dry etching process is performed in the process steps shown in FIG. 7B to remove the cap layers 136, 146 only, while the other process steps are same as those described in the above, as shown in FIG. 8. Referring to FIG. 8, the cap layers of the gate structures 130d and the gate structures 140b are removed, leaving only the spacers behind. This approach can also alleviate the parasitic capacitance generated due to the bit line coupling effect.

The structure of the semiconductor device in FIG. 8 is similar to that in FIG. 7D. The difference between the two structures is at the gate structures 130d and the gate structures 140b. The gate structures 130d include the gate conductive layers 132, 134, and the spacer 138, wherein the spacer 138 is higher than the gate conductive layers 132, 134. The gate structures 140b also includes the gate conductive layers 142, 144 and the spacer 148, wherein the spacer 148 is higher than the gate conductive layers 142, 144.

In this invention, the high dielectric constant material in the semiconductor device is replaced by the low dielectric constant material to lower the parasitic capacitance generated in the integrated circuit structure.

Further, the removal of the cap layer or the cap layer and the spacer further provides another advantage. After the removal of the cap layer or the cap layer and the spacer, the aspect ratio of the gap between the neighboring gate structures reduces. Therefore, in the subsequent deposition of the dielectric layer, generation of small crevices in the dielectric layer is prevented to preclude an electrical short generated between two neighboring conductive structures.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device structure, the structure comprising:
    an active region and an isolation region, disposed in proximity to each other on a substrate;
    a plurality of gate structures each having a gate conductive layer, disposed on the substrate, wherein each of first portions of the gate structures, disposed on the active region, further comprise a cap layer and a spacer, and second portions of the gate structures, disposed on the isolation region, do not comprise a cap layer and a spacer;
    a dielectric layer, disposed above the gate structures;
    a self-aligned contact, disposed in the dielectric layer and between two of the first portions of the gate structures; and
    a conductive line, disposed on the dielectric layer, wherein the conductive line electrically connects with the self-aligned contact,
    wherein a dielectric constant of the dielectric layer is lower than a dielectric constant of the cap layer and the spacer.

2. The structure of claim 1, wherein the spacer of one of the two first portions of the gate structures is disposed between the self-aligned contact and the gate conductive layer of said one of the two first portions of the gate structures, and between the self-aligned contact and a remaining part of the cap layer of said one of the two first portions of the gate structures.

3. The structure of claim 1 further comprising a metal silicide layer formed on a sidewall of each of the gate conductive layers of the second portions of the gate structures.

4. The structure of claim 3, wherein the gate conductive layer of one of the first portions of the gate structures has a sidewall that is not adjacent to the self-aligned contact, and said sidewall further comprises a metal silicide layer.

* * * * *